United States Patent [19]
Tanaka

[11] Patent Number: 5,883,424
[45] Date of Patent: Mar. 16, 1999

[54] LEAD FRAME FOR HOLLOW PLASTIC PACKAGE

[75] Inventor: Junichi Tanaka, Tokyo, Japan

[73] Assignee: NEC Corporation, Tokyo, Japan

[21] Appl. No.: 839,337

[22] Filed: Apr. 18, 1997

[51] Int. Cl.⁶ ................................................. H01L 23/495
[52] U.S. Cl. ......................... 257/666; 257/669; 257/674
[58] Field of Search ..................................... 257/666, 669, 257/674

[56] References Cited

U.S. PATENT DOCUMENTS

| | | |
|---|---|---|
| 3,793,474 | 2/1974 | Dunn et al. . |
| 3,899,305 | 8/1975 | Hilgers et al. . |
| 3,902,148 | 8/1975 | Drees et al. . |
| 3,947,867 | 3/1976 | Duffek et al. . |
| 4,721,993 | 1/1988 | Walter . |
| 4,924,292 | 5/1990 | Kaufman . |
| 5,053,852 | 10/1991 | Biswas et al. . |

FOREIGN PATENT DOCUMENTS

| | | |
|---|---|---|
| 62-184756 | 11/1987 | Japan . |
| 4-312963 | 11/1992 | Japan . |
| 5-190748 | 7/1993 | Japan . |
| 8-8375 | 1/1996 | Japan . |

*Primary Examiner*—Mahshid Saadat
*Assistant Examiner*—S. V. Clark
*Attorney, Agent, or Firm*—Foley & Lardner

[57] ABSTRACT

A lead frame for a hollow plastic package is constructed with a source lead, a pellet mounting portion provided at the central portion of the source lead and mounting a pellet, a lead gate and a drain gate symmetrically provided across the pellet mounting portion at the both sides thereof. Then, each lead is provided with substantially equilateral trapezoidal cut-off having the upper bottom and the lower bottom along the extending direction of the lead on a part of the lead, so that a lead bending portion is formed with a narrow part thereat.

16 Claims, 4 Drawing Sheets

LEAD FRAME FOR HOLLOW PLASTIC PACKAGE

BACKGROUND OF THE INVENTION

1. Field of the Invention

The present invention relates generally to a lead frame for a hollow plastic package. More specifically, the present invention relates to a lead frame for a hollow plastic package which is superior in package strength, lead strength and high frequency characteristics.

2. Description of the Prior Art

Conventionally, many semiconductor elements are used with an air-tight seal in order to protect themselves from humidity, temperature, contaminant or the like which otherwise causes degradation of characteristics of the element and shortening of life, and enhance mechanical strength for improving handling ability. Kinds of package with an air-tight seal can be classified to a hollow structure package using a ceramic casing and a resin sealed package of epoxy resin or the like. As the resin sealed package, there is a package formed by transfer molding of epoxy resin or the like, and thus completely covering the semiconductor element, and a hollow package which has hollow structure not completely covering the semiconductor element in order to avoid degradation of high frequency characteristics of the semiconductor element (Japanese Unexamined Patent Publication No. Hei 4-312963).

Recently, in order to reduce cost of semiconductor devices, particularly such as compound semiconductor devices, it has been required a low cost package that does not degrade high frequency characteristics. Therefore, it has been studied to turn a resin hollow structure package to practical use, in which the compound semiconductor element is not covered completely by the resin. A lead frame to be used in the resin hollow structure package is formed by bending leads outside of the plastic casing of the package in order to permit surface mounting for any packages. However, stress is caused on the plastic casing upon bending formation of the leads to be a cause of faulty product. Thus, in order to reduce the stress, it has been attempted to make the overall leads thinner.

FIG. 1A is a section showing one example of peeling off of a conventional plastic casing, and FIG. 1B is a section showing one example of peeling off of a conventional lead. Even in an attempt to reduce the stress by making overall leads thinner, slight peeling off 401 of the casing at a portion where the plastic casing contact with the lead and peeling off 402 of the lead within the plastic casing can be caused due to stress upon bending formation of the lead of the lead frame as to a resin hollow structure package (hollow plastic package). The reason is that while the backside of the lead frame of the hollow plastic package is covered with the resin, the surface side is merely held by a ring-shaped or quadrangular ridge (wall) structure for sealing a cap later. Namely, when the overall leads are formed to be narrower, a force to depress the lead becomes smaller in comparison with the plastic package by normal transfer molding. Thus, the plastic casing and the lead cannot withstand the stress upon bending formation to cause peeling off 401 of the casing and peeling off of the lead 402.

On the other hand, when the overall leads are made thinner, input/output impedance becomes large, especially upon use of high frequency to cause difficulty in impedance matching when the application is used and to make it difficult to obtain a good grounding condition.

SUMMARY OF THE INVENTION

It is an object of the present invention to provide a lead frame which can improve package strength, lead strength and high frequency characteristics of a hollow plastic package.

A lead frame according to the present invention is to be used in a plastic package of hollow structure, in which a surface of a semiconductor element is not in contact with a seal resin member. The lead frame has a lead having a narrow lead bending portion to be provided with bending process.

In the lead frame, the lead bending portion may have a substantially equilateral trapezoidal cut-off having the upper bottom and the lower bottom along the extending direction of the lead or a substantially semi-circular cut-out having the chord along the extending direction of the lead.

On the other hand, in the lead frame, the width of the lead bending portion may be 0.5 mm and the width of the lead at a portion which is not the lead bending portion may be greater than or equal to 1.0 mm.

Furthermore, the lead frame may be formed of one kind of metal selected from a group consisted of copper, iron, aluminum and alloy thereof.

The lead frame may be plated over the entire or partial surface.

In the lead frame, the plating may be performed with one kind of plating material selected from a group consisted of gold, silver, nickel and solder.

The lead frame may be connected to a compound semiconductor pellet via bonding wires and taken in a hollow package formed with a plastic casing and a plastic cap.

In the lead frame, the bonding wire may be one kind of metal selected from a group consisted of gold, aluminum and alloy thereof.

On the other hand, in the lead frame, the compound semiconductor pellet may be fixed by Ag paste.

In the lead frame, the plastic casing and the plastic cap may be formed of one kind of material selected from a group consisted of epoxy resin, polyimide resin, phenol resin, unsaturated polyester resin, silicon resin, liquid crystal polymer, polyphenylene sulfide resin and polysulfone resin.

In the lead frame, the plastic casing and the plastic cap may be mutually bonded with one kind of bond selected among a group consisted of epoxy type bond, imide type bond and acryl type resin.

In the lead frame, the lead may be a source lead connected to a source electrode of an FET, a gate lead connected to a gate electrode of the FET and a drain lead connected to a drain electrode of the FET.

In the present invention, by forming the lead width narrower at the portion to be performed of lead bending formation, the stress acting on the plastic casing upon lead forming can be reduced. Therefore, upon lead formation of the hollow plastic package, peeling off of the plastic casting and peeling off of the lead can be successfully restricted.

On the other hand, the portion to narrow the width for reducing the stress is not the entire lead, but limited to the lead bending portion. Therefore, an input/output impedance can be lowered. Input/output impedance alignment is facilitated to achieve superior high frequency characteristics. Also, since the lead width in the mounting portion can be thick to achieve good grounding ability.

BRIEF DESCRIPTION OF THE DRAWINGS

The present invention will be understood more fully from the detailed description given hereinafter and from the accompanying drawings of the preferred embodiment of the invention, which, however, should not be taken to be limitative to the present invention, but are for explanation and understanding only.

In the drawings:

FIGS. 3A and 3B are illustrations showing a hollow plastic package employing the first embodiment of a lead frame according to the present invention, in which FIG. 3A is a plane view and FIG. 3B is a section.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however to those skilled in the art that the present invention may be practiced without these specific details. In other instance, well-known structures are not shown in detail in order to not unnecessarily obscure the present invention.

Figure 1A:
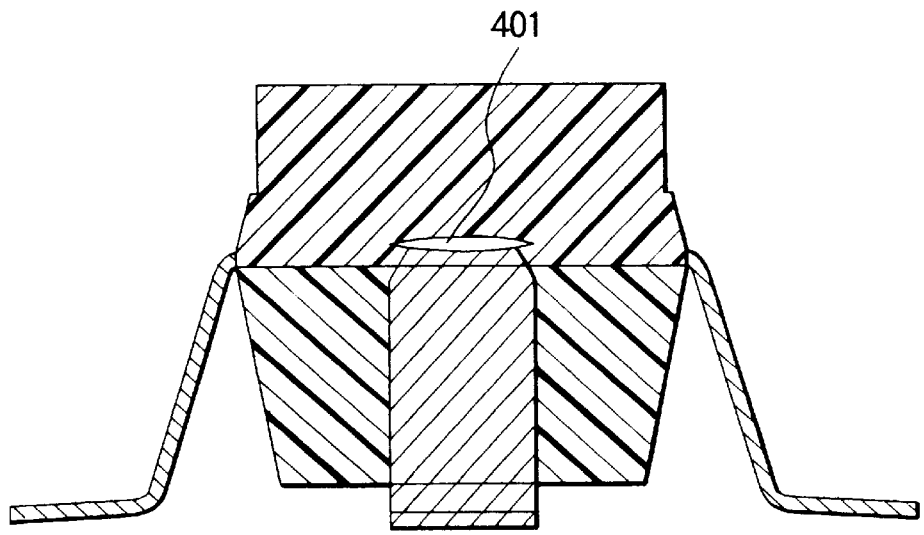
FIG. 1A is a section showing one example of peeling off of a conventional plastic package.
Figure 1B:
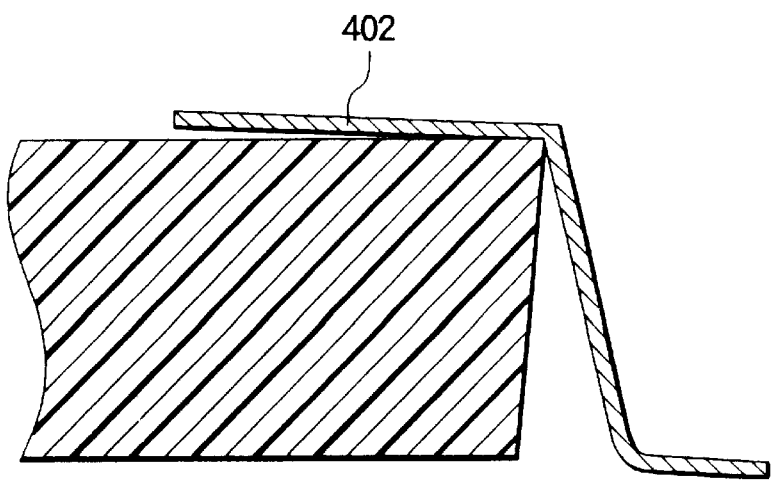
FIG. 1B is a section showing one example of peeling off of a conventional lead.
Figure 2:
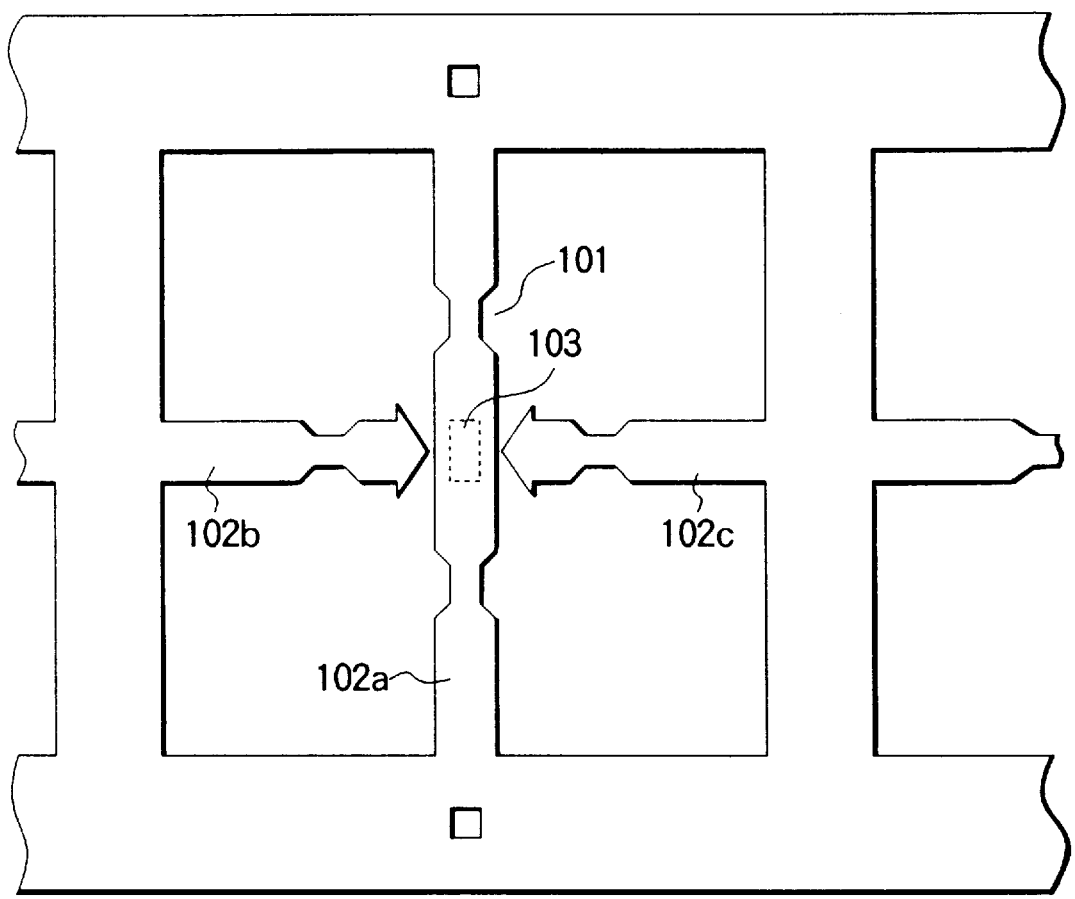
FIG. 2 is a plan view showing the first embodiment of a lead frame according to the present invention.

FIG. 2 is a plan view showing the first embodiment of a lead frame according to the present invention. The first embodiment of the lead frame is constructed with a source lead frame 102a, a pellet mount portion 103 provided at the central portion of the source lead 102a and mounting a pellet, a lead gate 102b and a drain lead 102c symmetrically provided across the pellet mount portion 103 at both sides thereof. On respective leads 102a, 102b and 102c, substantially equilateral trapezoidal cut-outs having the upper bottom and the lower bottom along the extending direction of the lead on parts of the side edges are provided. With these cut-outs, lead bending portions 101 having smaller width are formed at parts of the leads.

Figure 3A:
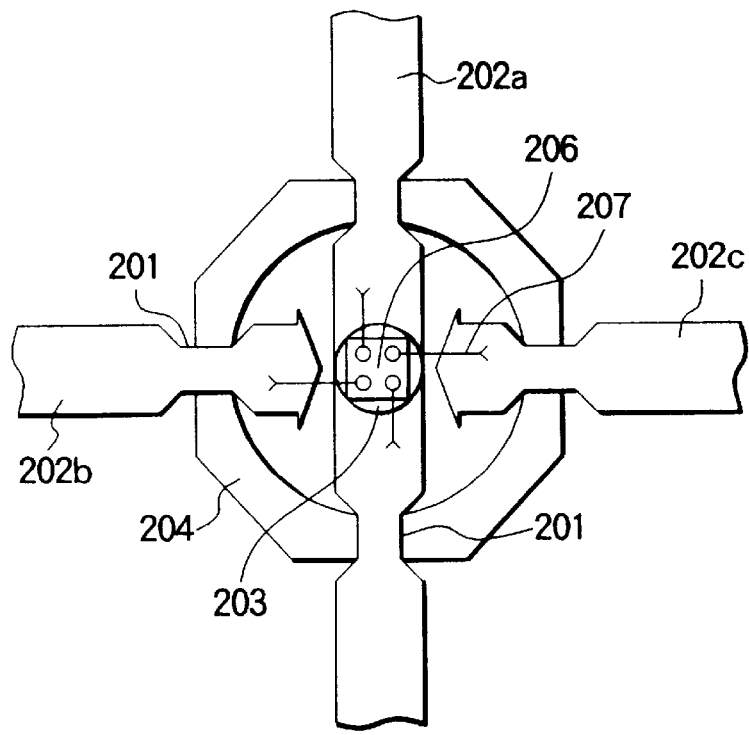
Figure 3B:
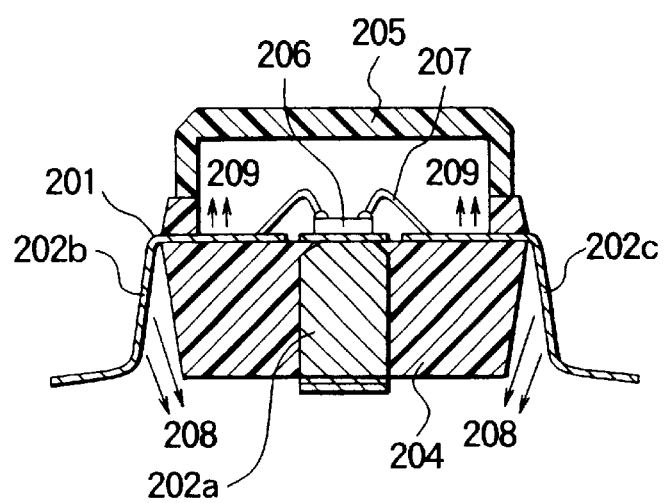

FIGS. 3A and 3B are illustrations showing a hollow plastic package employing the first embodiment of a lead frame according to the present invention. FIG. 3A is a plan view and FIG. 3B is a section. Within the hollow plastic package employing the first embodiment of the lead frame, a source lead 202a, a compound semiconductor pellet 206 mounted on a pellet mounting portion provided at the central portion of the source lead 202a, a gate lead 202b and a drain lead 202c symmetrically provided across the compound semiconductor pellet 206 at both sides thereof are provided. For respective leads 202a, 202b and 202c, lead bending portions 201 are formed. Also, Ag paste for fixing the compound semiconductor pellet 206 on the pellet mounting portion of the source lead 202a is applied on the pellet mounting portion. To the compound semiconductor pellet 206, bonding wires 207 are connected to respective leads 202a, 202b and 202c. These members are taken in a plastic casing 204 and a plastic cap 205.

Then, in the hollow plastic package constructed as set forth above, respective leads 202a, 202b and 202c are bent at respective lead bending portions 201 and thus are formed to contact to the upper surface of the plastic casing at the portions closer to the compound semiconductor 206 than the lead bending portions 201. Upon formation, stresses 208 and 209 act on the leads 202b and 202c, and the plastic casing 204, which would cause peeling off of the casing and peeling off of the lead in the prior art.

In the shown embodiment, by providing a narrower width at the lead bending portion 201 as a part of the lead, the stresses 208 and 209 to be generated during bending process can be reduced to successfully prevent peeling off of the plastic casing and peeling off of the lead. In this case, when the width of the lead bending portion 201 is 0.5 mm, the width of the leads 202a, 202b and 202c which are not the lead bending portions 201 is greater than or equal to 1.0 mm, peeling off of the plastic casing and peeling off of the lead can be successfully prevented and thus the strength of the casing, the strength of the lead and high frequency characteristics will not be lowered. Therefore, it is preferred that the width of the lead bending portion 201 is 0.5 mm, the width of the leads 202a, 202b and 202c which are not the lead bending portions 201 is greater than or equal to 1.0 mm. However, such dimensions are not essential to the present invention. Namely, the width of the lead bending portion 201 is not necessarily 0.5 mm, and the width of the leads 202a, 202b and 202c of the portion which are not the lead bending portion 201 can be less than 1.0 mm.

It should be noted that the material of the lead frame is not specified. For example, copper, iron, aluminum and alloys thereof may be used as the material of the lead frame.

Also, plating may be provided over the entire or partial surface of the lead frame. As the plating material, gold, silver, nickel, solder and the like may be used, for example.

The material of the bonding wire 207 is not specified. For example, gold, aluminum and alloy thereof can be used.

The materials of the hollow plastic casing and plastic cap are not specified. For example, epoxy resin, polyimide resin, phenol resin, unsaturated polyester resin, silicon resin, liquid crystal polymer, polyphenylene sulfide resin and polysulfone resin and the like can be used.

The hollow plastic package is formed by bonding the plastic casing and plastic cap with bond agent. As the bond agent, for example, epoxy type bond, imide type bond, acryl type bond and the like may be used.

Figure 4:
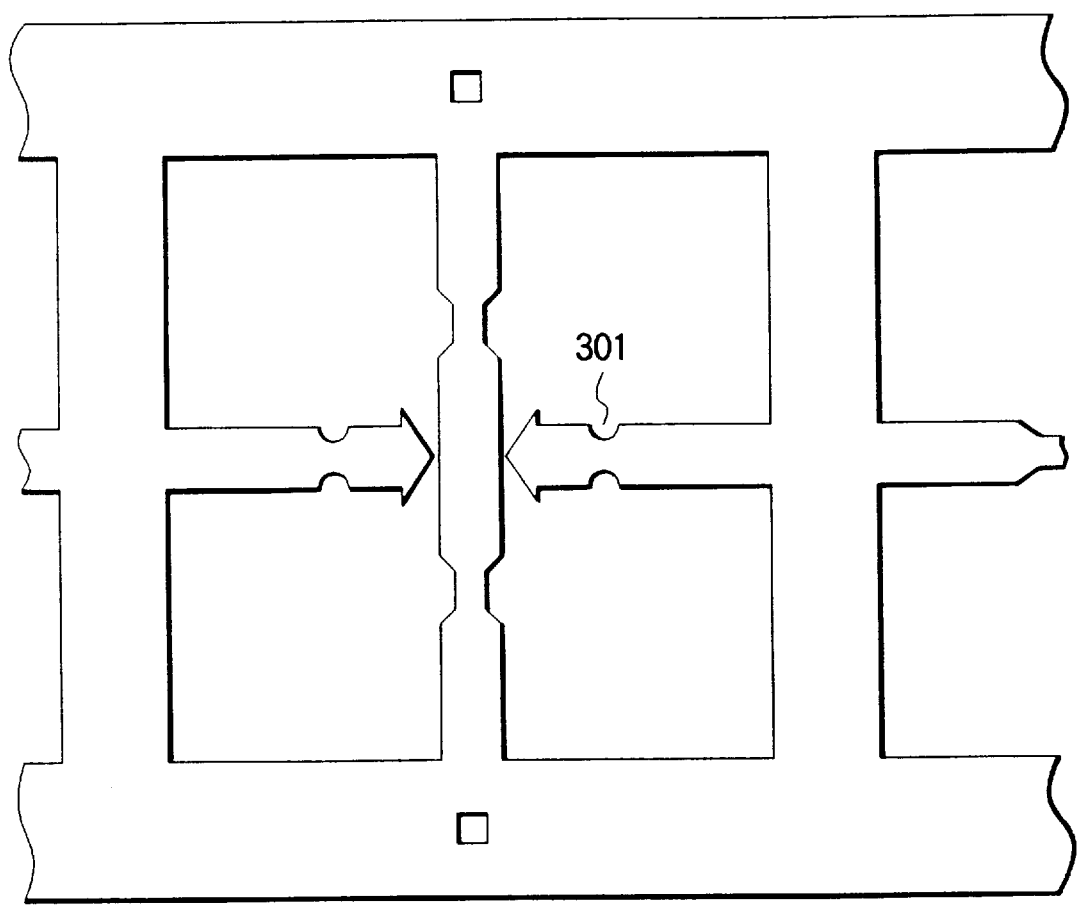
FIG. 4 is a plan view of the second embodiment of a lead frame according to the present invention.

Next, the second embodiment will be discussed with reference to FIG. 4. FIG. 4 is a plan view of the second embodiment of a lead frame according to the present invention. The shown embodiment of the lead frame has the same construction as that of the first embodiment except for the shape of the lead bending portion. Each of the lead bending portions 301 of the shown embodiment is provided with substantially semicircular cut-outs having the chord along the extending direction of the lead at parts of the side edges of the lead. In the hollow plastic package employing the lead frame constructed as set forth above, similarly to the first embodiment of the lead frame, peeling off of the casing and peeling off of the lead which occurs in conventional devices, can be successfully prevented.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the features set out in the appended claims.

What is claimed is:

1. A lead frame to be used in a plastic package of hollow structure, in which a surface of a semiconductor element is not in contact with a seal resin member, comprising:

a lead having a narrow lead bending portion to be provided with a bending process, wherein said lead bending portion has a pair of substantially equilateral trapezoidal cut-outs, one having an upper bottom and an other having a lower bottom, each of said pair of substantially equilateral trapezoidal cut-outs disposed along an extending direction of said lead, and wherein said upper bottom and said lower bottom are disposed directly opposite each other on said lead bending portion.

2. A lead frame as set forth in claim 1, wherein the width of said lead bending portion is 0.5 mm and the width of said lead at a portion which is not said lead bending portion is greater than or equal to 1.0 mm.

3. A lead frame as set forth in claim 1, which is formed of one kind of metal selected from a group consisted of copper, iron, aluminum and alloy thereof.

4. A lead frame as set forth in claim 1, which is plated over the entire or partial surface.

5. A lead frame as set forth in claim 4, wherein said plating is performed with one kind of plating material selected from a group consisted of gold, silver, nickel and solder.

6. A lead frame as set forth in claim 1, which is connected to a compound semiconductor pellet via bonding wires and taken in a hollow package formed with a plastic casing and a plastic cap.

7. A lead frame as set forth in claim 6, wherein said bonding wire is one kind of metal selected from a group consisted of gold, aluminum and alloy thereof.

8. A lead frame as set forth in claim 6, wherein said compound semiconductor pellet is fixed by Ag paste.

9. A lead frame as set forth in claim 6, wherein said plastic casing and said plastic cap is formed of one kind of material selected from a group consisted of epoxy resin, polyimide resin, phenol resin, unsaturated polyester resin, silicon resin, liquid crystal polymer, polyphenylene sulfide resin and polysulfone resin.

10. A lead frame as set forth in claim 6, wherein said plastic casing and said plastic cap are mutually bonded with one kind of bond selected from a group consisted of epoxy type bond, imide type bond and acryl type resin.

11. A lead frame as set forth in claim 1, wherein said lead is a source lead connected to a source electrode of an FET, a gate lead connected to a gate electrode of said FET and a drain lead connected to a drain electrode of said FET.

12. A lead frame as set forth in claim 1, wherein the lead bending portion and all remaining portions of the lead have a flat planar surface defining a top surface of the lead, prior to the bending process.

13. A lead frame as set forth in claim 12, wherein the lead bending portion is disposed in a middle portion of the lead.

14. A lead frame to be used in a plastic package of hollow structure, in which a surface of a semiconductor element is not in contact with a seal resin member, comprising:

a lead having a narrow lead bending portion to be provided with a bending process, wherein said lead bending portion has a first semicircular cut-out and a second semicircular cut-out each disposed along an extending direction of said lead, and wherein said first semicircular cut-out and said second semicircular cut-out are disposed directly opposite each other on said lead bending portion.

15. A lead frame as set forth in claim 14, wherein the lead bending portion and all remaining portions of the lead have a flat planar surface defining a top surface of the lead, prior to the bending process.

16. A lead frame as set forth in claim 15, wherein the lead bending portion is disposed in a middle portion of the lead.

* * * * *